United States Patent [19]

Ohno

[11] 3,983,487
[45] Sept. 28, 1976

[54] FM-AM CONVERTER
[75] Inventor: Masaharu Ohno, Yokohama, Japan
[73] Assignee: Sony Corporation, Tokyo, Japan
[22] Filed: Aug. 6, 1975
[21] Appl. No.: 602,186

[30] Foreign Application Priority Data
Aug. 14, 1974 Japan............................ 49-92903

[52] U.S. Cl. .................................. 325/315; 325/7; 325/461; 332/1
[51] Int. Cl.² .................................. H04B 1/06
[58] Field of Search ..................... 325/315–317, 325/397, 399, 408, 409, 442, 461, 7, 45, 182; 332/1, 31 R, 47, 37 R; 329/1, 131, 132, 136

[56] References Cited
UNITED STATES PATENTS

| | | |
|---|---|---|
| 2,286,997 | 6/1942 | Hunt .................................. 325/315 |
| 2,378,581 | 6/1945 | Roberts .................................. 325/7 |
| 3,447,088 | 5/1969 | Guyton et al. ..................... 325/461 |
| 3,528,037 | 9/1970 | Yamazaki ........................... 332/1 |
| 3,882,397 | 5/1975 | Konishi ................................ 332/1 |

Primary Examiner—Robert L. Griffin
Assistant Examiner—Jin F. Ng
Attorney, Agent, or Firm—Lewis H. Eslinger; Alvin Sinderbrand

[57] ABSTRACT

An FM-AM converter in which the FM signal is applied to a slope filter in a transmission system. The resulting amplitude modulated FM signal is applied to a circuit that derives a control signal corresponding to the mean value of the amplitude modulated FM signal and uses this control signal to control either the gain of the FM signal applied to the slope filter or the frequency response of the slope filter so that the amplitude of the amplitude modulated FM signal will have a predetermined mean value.

7 Claims, 12 Drawing Figures

FM-AM CONVERTER

BACKGROUND OF THE INVENTION

1. Field of the Invention

This invention relates to an improved FM-AM converter system in which the FM signal is first changed into an amplitude modulated FM signal, and a separate carrier signal is then modulated by the envelope of the amplitude modulated FM signal.

2. The Prior Art

It has been known in the past to convert an FM signal into an AM signal by applying the FM signal at a constant amplitude to a filter having a montonically sloping characteristic, which is preferably linear with respect to frequency over a frequency range necessary to respond to all frequencies within the band of the FM signal. The effect of such a filter on the FM signal is to change that signal into an amplitude modulated FM signal in which the amplitude modulation envelope corresponds to the signal that produced the original frequency modulation. The envelope of amplitude modulated signal can be demodulated by an amplitude demodulator, or detector, to retrieve the original modulating signal. This original signal can then be used to modulate the amplitude of another carrier to achieve amplitude modulation without the accompanying frequency modulation (except to the extent that amplitude modulation inherently affects the frequency of the carrier).

It is expected that the instantaneous frequency of the frequency modulated signal will have a certain value, which may be referred to as $f_o$, when the amplitude of the modulating signal is zero. As the modulating signal swings positive and negative about its zero axis, the frequency modulated carrier swings between frequency values above and below the nominal frequency $f_o$.

However, the frequency $f_o$ may drift or shift from its proper value so that when the FM signal is applied to the filter that has a sloping characteristic, the peaks of each of the individual cycles of the resulting amplitude modulated FM signal will all be shifted to a greater or a lesser amplitude than the desired amplitude, depending upon whether the frequency $f_o$ shifts positively or negatively. This causes the amplitude demodulated signal, which normally is offset from a zero value by a certain amount, to be offset a greater or lesser amount. This is particularly disadvantageous if the offset is toward a lesser amount because negative peaks of the demodulated signal will then approach the zero amplitude value more closely. If the offset is sufficient, when this demodulated signal is used to amplitude modulate the second carrier to produce the final AM signal, the resultant Am signal will be distorted during those instands when the modulating signal is at such negative peak values.

SUMMARY OF THE INVENTION

It is an object of the present invention to provide means to correct the transmission of signals through an FM-AM converter such that the output AM signal will not be distorted at negative peak values of the modulating signal.

It is another object of the present invention to provide means for controlling the amplitude of the amplitude modulated FM signal so that its amplitude at instants corresponding to zero amplitude of the modulating signal will have a substantially fixed value.

A further object of the present invention is to provide means to control the frequency response of the filter having a sloping characteristic to adjust the amplitude of the output signal to a predetermined value when the FM signal has the frequency value $f_o$.

Further, objects will become apparent from the following specification and drawings.

In accordance with this invention a control signal is derived from the envelope of the amplitude modulated FM signal. The control signal is passed through a smoothing filter so that its amplitude corresponds to the mean value of the envelope. The smooth control signal is then applied to a control circuit that causes the amplitude of the output signal of the filter to have a certain value when the instantaneous frequency of the FM signal is at its nominal, or unmodulated, value. The control circuit may be a variable gain circuit connected in cascade with and ahead of the filter or it can be a circuit to shift the active part of the sloping characteristic of the filter to a higher or lower frequency range.

DETAILED DESCRIPTION OF THE INVENTION

Figure 1:
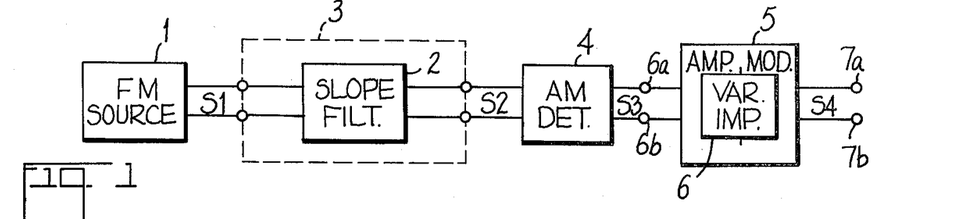
FIG. 1 is a block diagram showing one example of an FM-AM converter.

The FM-AM converter shown in FIG. 1 includes an FM signal source 1, such as, for example, a carrier in the U.H.F. band of 470~770 MHz converted from the S.H.F. band frequency modulated by a video signal, connected to input terminals of a slope filter 2 in a transmission system 3. The output terminals of the filter 2 are connected to the input terminals of an amplitude demodulator, or envelope detector, 4, which is connected, in turn, to the input terminals 6a and 6b of an amplitude modulator 5. The amplitude modulator includes a carrier source (not shown) that may have a frequency in the V.H.F. band of 90–230 MHz and a variable impedance element 6, the impedance of which changes with voltage or current. The variable impedance element 6 may or may not operate as a rectifier. The amplitude modulated signal is developed across the output terminals 7a and 7b of the amplitude modulator 5.

The operation of the circuit in FIG. 1 will be described with reference to some of the waveforms in FIG. 3. The information signal used to modulate a carrier in the FM source 1 is illustrated as a sinusoidal signal E1, although it may actually be a complex signal with many frequency components of different amplitudes, and the effect of modulating a carrier with ths signal is to produce a signal S1 which is available at the output terminals of the FM source 1. The amplitude of the FM signal S1 is substantially constant, but when it is applied to the slope filter 2, which has a linear frequency response characteristic of the type illustrated by the line AO in FIG. 4, the output signal of the filter 2 is illustrated by the waveform S2, which is a carrier that is both frequency modulated and amplitude modulated by the same modulating signal E1.

When the amplitude modulated FM signal S2 is applied to the envelope detector 4, the high frequency carrier wave is separated from the low frequency information signal S3. The waveform of the signal S3 corresponds to the information signal E1 but is displaced from the zero axis since it represents a signal derived from the peaks of the amplitude modulated FM signal S2. The signal S3 is used in the amplitude modulator 5 to modulate another carrier signal to produce at the output terminals 7a and 7b a purely amplitude modulated signal S4.

Figure 2:
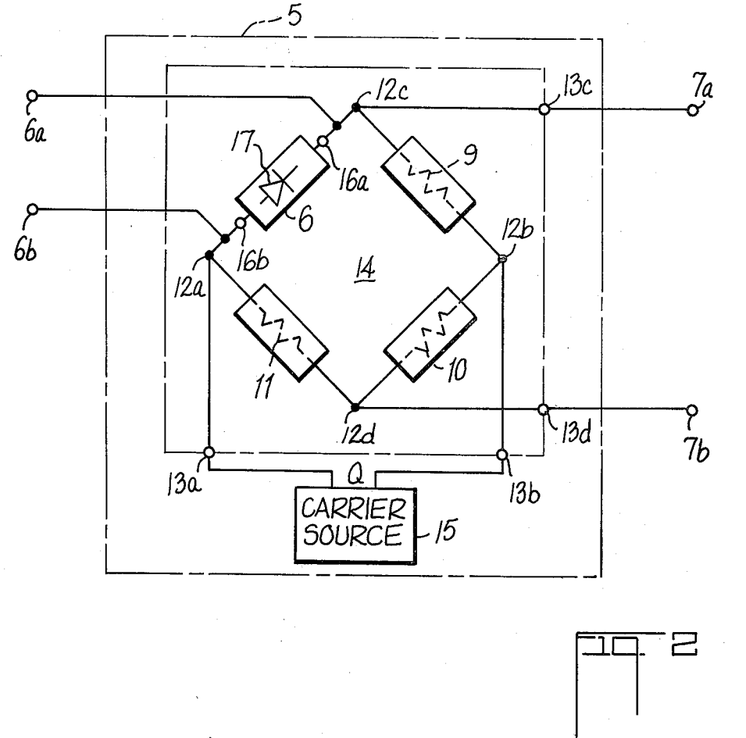
FIG. 2 is a schematic diagram of one type of amplitude modulator for use in the circuit in FIG. 1.

FIG. 2 shows an embodiment of an amplitude modulator 5 suitable for use in the circuit in FIG. 1. The amplitude modulator 5 has the same input terminals 6a and 6b as in FIG. 1 to be connected to the envelope detector 4 in FIG. 4 and also has the output terminals 7a and 7b shown in FIG. 1. The amplitude modulator in FIG. 2 includes a bridge circuit comprising three series-connected impedances 9–11, which may be fixed impedances. The impedances 10 and 11 are connected in series between two points 12a and 12b and the impedances 9 and 10 are connected in series between two other points 12c and 12d of a bridge circuit. The points 12a–12d are connected, respectively, to four terminals 13a–13d and are the four corners of a bridge circuit 14 within the amplitude modulator 5. A carrier source 15 is connected to the terminals 13a and 13b to be applied across opposite corners 12a and 12b of the bridge circuit 14.

The impedance 6 is connected between two terminals 16a and 16b in the fourth arm of the bridge 14 between the corners 12a and 12c and opposite the impedance 10. The variable impedance element in the impedance 6 is illustrated as a diode 17, and the input terminals 6a and 6b are connected directly to the terminals 16a and 16b in this arm of the bridge circuit 14.

The operation of the circuit in FIG. 2 will also be described with reference to some of the waveforms in FIG. 3. When the signal S3 is applied across the terminals 6a and 6b, it causes the impedance Z6 of the variable impedance 6 to vary according to the curve DO that corresponds in shape to the waveform of the signal S3 except that it is inverted. This variation in the impedance 6 varies the extent of imbalance of the bridge 14 and thus changes the amplitude of the carrier signal Q from the source 15 transferred through the bridge to the output terminals 7a and 7b. This in effect modulates the amplitude of the carrier Q from the source 15 to produce the amplitude modulated signal S4. Since the carrier Q has a fixed frequency, the frequency modulation in the amplitude modulated signal S2 is not present in the signal S4 and thus the signal S1, which is a pure FM signal, is converted to the signal S4, which is a pure AM signal. Moreover, the frequency of the carrier Q may be quite different from the carrier in the signal S1.

Figure 5:
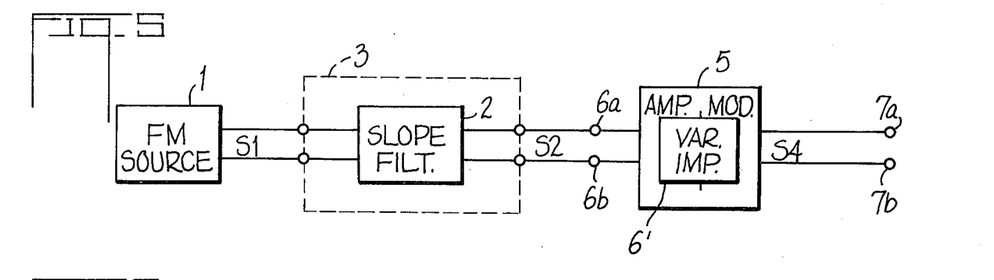
FIG. 5 is a block diagram of another embodiment of an FM-AM converter.

FIG. 5 shows another form of FM-AM converter. It includes the same FM source 1 as in FIG. 1 and the same slope filter 2 in the transmission system 3. The input terminals of the slope filter 2 are connected directly to the output terminals of the source 1, just as in FIG. 1. However, there is no envelope detector, as such, in the circuit in FIG. 5 but instead the output terminals of the slope filter 2 are connected directly to the input terminals 6a and 6b of an amplitude modulator 5' that includes a variable impedance 6'. An amplitude modulated signal is obtained at the output terminals 7a and 7b of the amplitude 5', similar to the signal S4 obtained at the output terminals 7a and 7b of the amplitude modulator 5 in FIG. 1.

Figure 6:
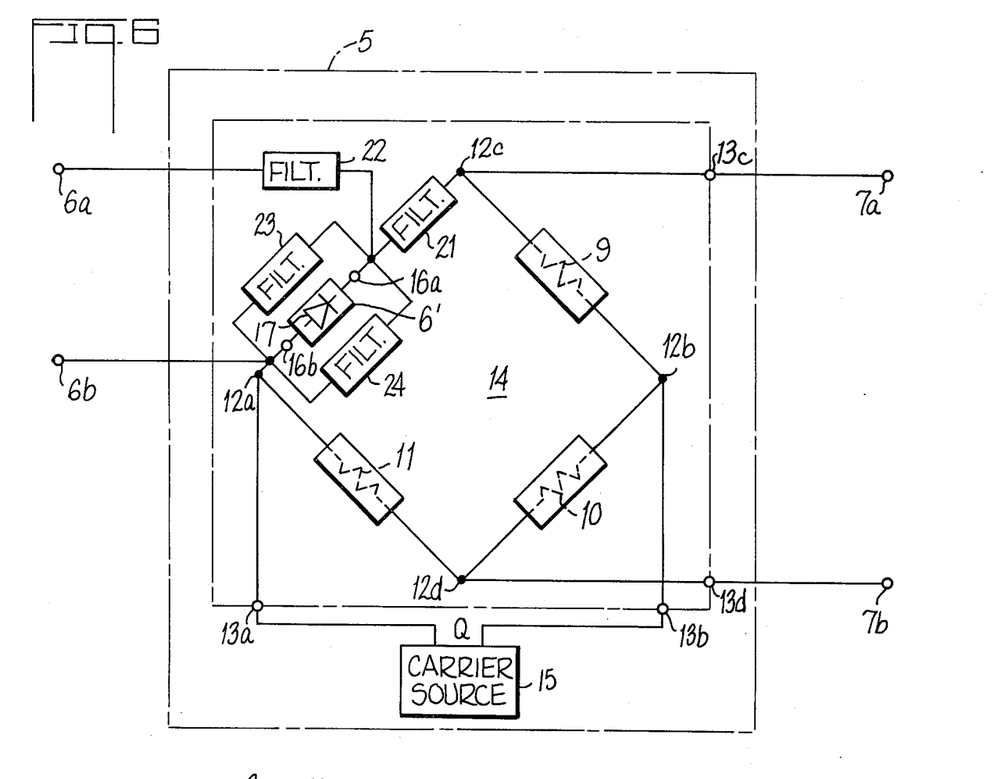
FIG. 6 is a schematic diagram of one embodiment of an amplitude modulator used in the circuit of FIG. 1.

Before describing the operation of the circuit in FIG. 5 it will be necessary to describe the amplitude modulator 5' in FIG. 6. The amplitude modulator includes the same impedances 9–11 connected in a bridge circuit 14 and supplied with the same signal Q from the carrier source 15 as in FIG. 2. However, the arm of the bridge 14 between the corners 12a and 12c is different in FIG. 6 from the corresponding arm of the bridge 14 in FIG. 2. In FIG. 6 there is a variable impedance 6', which must have a rectifying function since there is no separate envelope detector as there was in the circuit in FIG. 1. The impedance 6' is connected between the terminals 16a and 16b, and a filter 21 is connected in series between the terminals 16a and the corner 12c of the bridge 14. The terminal 21 permits the carrier signal from the source 15 to pass but does not permit the signal S2 to pass. This means that the carrier frequency of the signal S2 must be sufficiently different from the frequency of the signal Q from the source 15 in the embodiment in FIG. 6.

The input terminal 6b is connected directly to the terminal 16b of the variable impedance 6', but a filter 22 is connected in series between the other input terminal 6a and the terminal 16a of the impedance 6'. This filter 22 permits the passage of the signal S2 but prevents the signal Q from the carrier source 15 from feeding back through the terminal 6a.

Two other filters 23 and 24 are connected directly in parallel with the impedance 6'. The filter 23 permits signals having a frequency equal to the difference between the frequencies of the signal S2 and the signal Q to pass. The filter 24 is tuned to permit signals having a frequency equal to the sum of the frequencies of the signals S2 and Q to pass through. The filters 23 and 24 may be LC series resonant circuits. Of course, the signal S2 is not a single frequency signal but has side bands relatively close to it.

The operation of the circuit in FIG. 6 is generally similar to that of the circuit in FIG. 2. Due to the filter 22 the amplitude modulated FM signal derived from the filter 2 in FIG. 5 and applied to the input terminals 6a and 6b is applied across the impedance element 6', which includes the diode 17. The filters 23 and 24 shunt undesired sum and difference signals around the element 6' so that only the frequency components of the band of the signal S2 in FIg. 3 are applied to the elements 6'. A detecting current $I_6$ flows in the element 6' and the impedance $Z_6$ of the element 6' undergoes the same change as described previously in connection with the circuit in FIG. 2. The variation of the impedance $Z_6$ follows a curve DO in FIG. 3. The variation of the current $I_6$ follows the curve GO in FIG. 3 and is identical to the waveform of the output signal S3 in FIG. 3, that was obtained from the envelope detecting circuit 4 in FIG. 1.

The modulation of the impedance of the element 6' in the circuit in FIG. 6 produces the same amplitude modulated signal S4 from the output terminals 7a and 7b of the amplitude modulator 5, as was obtained in the circuit of FIG. 2. The FM-AM converters described with regard to FIGS. 1 and 5 have the advantage of simple construction as compared with other FM-AM converters proposed heretofore.

In the description of the operation of the converters in FIGS. 1 and 5 with the respective amplitude modulators in FIGS. 2 and 6, it has been assumed that the reference frequency $f_o$ is correct. The frequency $f_o$ is the nominal carrier frequency of the frequency modulated carrier in the signal S1 in FIG. 3 and is thus the frequency representing no modulation of the carrier. Such a condition occurs when the modulating signal E1 in FIG. 3 passes through, or remains in, the zero condition. For a given amplitude of the signal S1 in FIG. 3, the application of this signal to the slope filter 2 in either FIG. 1 or FIG. 5 should produce a certain output amplitude of the filter according to the intercept of the frequency response curve AO with the line representing the frequency $f_o$ in FIG. 4.

This desired condition may not always exist. By the time the signal S1 in FIG. 3 reaches the transmission system 3 where it can be applied to the slope filter 2 in either FIG. 1 or FIG. 5, the frequency $f_o$ may be displaced slightly from its expected value. As a result, the frequencies in the signal S1 may be offset either higher or lower than expected. This can cause the same effect as if the response characteristic AO of the filter 2 as shown in FIG. 4 were shifted into the positions indicated as AH as a dotted line or AL indicated as a broken line. In those cases the intercept of the frequency $f_o$ would result in either a lower or higher voltage at the output of the filter 2.

Figure 3:
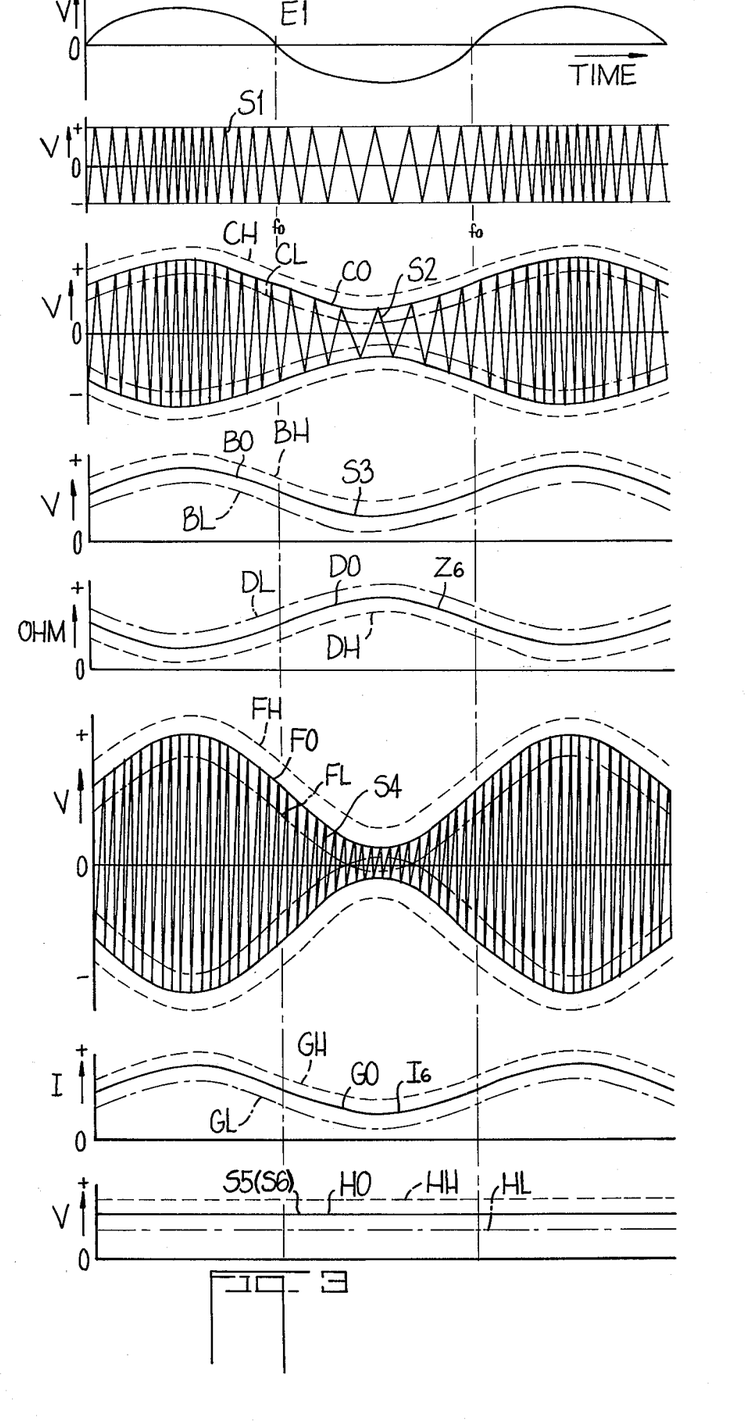
FIG. 3 shows graphical representations of signals obtained in the operation of circuits described herein.
Figure 4:
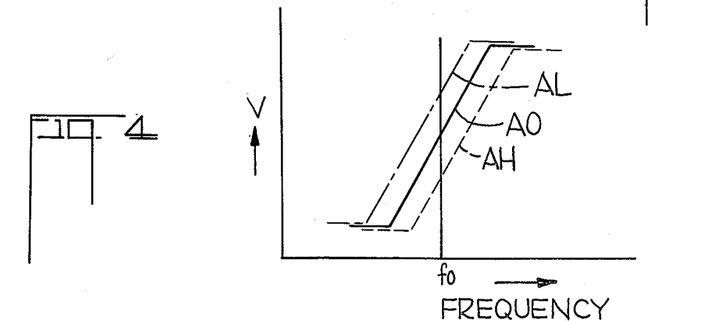
FIG. 4 is a graphical representation of a slope filter used in the circuits described herein.

This would cause the envelope of the output signal S3 in FIG. 3 to deviate from the solid line CO to the curves CH or CL shown, respectively, as a dotted line and a broken line. When the envelope of the signal S2 is detected to produce the signal S3, that signal would no longer follow the desired solid curve BO but would instead follow the curve BH shown as a dotted line or the curve BL shown as a broken line. Correspondingly, the impedance $Z_6$ would follow either the curve DH shown as a dotted line or the curve DL shown as a broken line in FIG. 3 and would result in an amplitude modulated signal S4 that did not follow the desired curve FO but instead followed either the curve FH shown as a dotted line or the curve FL shown as a broken line. It may be seen that in the latter curve, there is a danger of over-modulation and distortion of the signal.

The foregoing results could also be obtained if there were a drift in the frequency response of the slope filter 2 that caused a raising or lowering of its center-frequency $f_o$.

Figure 7:
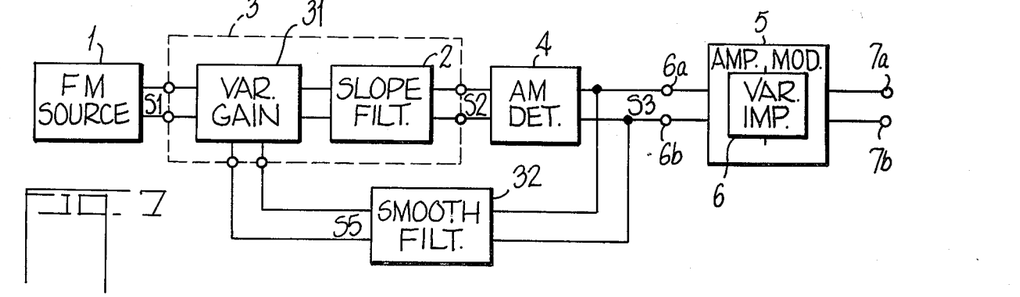
FIG. 7 is a block diagram illustrating one embodiment of an FM-AM converter according to the present invention.

FIG. 7 shows a converter similar to that in FIG. 1 but including means to compensate for drifting of the frequency $f_o$ either in the signal S1 or in the frequency response of the slope filter 2. Most of the components in the circuit in FIG. 7 are identical with those in FIG. 1 and are indicated by the same reference numerals. An additional element is a variable gain circuit 31 connected between the input terminals of the transmission system 3 and the input of the slope filter 2. A smoothing circuit 32 has input terminals connected to the output terminals of the envelope detector 4. The output terminals of the smoothing circuit 32 are connected to control terminals of the variable gain circuit 31 in the transmission system 3.

The operation of the circuit in FIG. 7 is generally similar to that of the circuit in FIG. 1. The smoothing circuit 32 is basically a very long time constant circuit, or the equivalent, that is not responsive to frequencies in the signal S3 at the output of the envelope detector 4. Instead, the output signal of the smoothing circuit 32 is a steady, direct voltage signal S5 shown in FIG. 3. When the frequency $f_o$ of the signal S1 is at the correct value, the signal S5 is represented by the straight line HO, but when the frequency $f_o$ or the operation of the filter 2 shifts, the amplitude of the output signal of the circuit 32 shifts to the value HH shown as a dotted line or the value HL shown as a broken line.

The output signal of the smoothing circuit 32 is used to control the gain of the variable gain circuit 31 in the transmission system 3 at a point ahead of the filter 2 so that the amplitude of the FM signal S1 applied to the filter 2 will have the correct value to produce a correct amplitude of the signal S2 when the modulating signal E1 goes through, or remains in, its zero amplitude condition. As a result, even if the frequency $f_o$, called the reference frequency, of the FM signal S1 rises (or lowers) resulting in a decrease (or increase) of the modulation degree of the output signal S4 of the amplitude modulated wave at the terminals 7a and 7b, the deviation of the output signal S3 of the envelope detector 4 from the correct value BO to the value BH (or BL) causes the control signal S5 at the output of the smoothing circuit 32 to increase (or decrease) from the normal value HO to the valve HH (or the value HL). The polarity of operation of the variable gain control circuit 31 is selected to bring the operation of the transmission system 3 back to the desired condition. The variable gain control circuit 31 does not actually change the center frequency $f_o$ of the slope filter 2 but achieves the same effect as if that center frequency had been changed, thereby preventing distortion in the signal S4.

Figure 8:
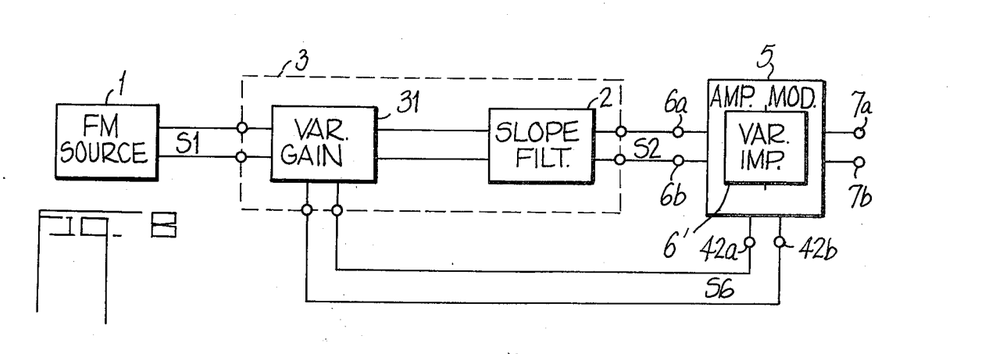
FIG. 8 is a block diagram of another embodiment of a converter according to the present invention.

FIG. 8 shows an FM-AM converter similar to that in FIG. 5 but with the control means 31 of the circuit in FIG. 7. To the extent that the components in FIG. 8 are similar to those of prior figures, the same reference numerals are used. Since the variable impedance element 6' in the amplitude modulator 5 includes a rectifying element, it is unnecessary to provide a separate envelope detector similar to the envelope detector 4 in FIG. 7. Instead, the amplitude modulator 5 includes not only envelope detecting means but also a smoothing circuit that takes the place of the smoothing circuit 32 in FIG. 7. FIG. 8 includes output terminal means 42a and 42b for the amplitude modulator 5, and these output terminals are output terminals of the smoothing circuit section within the amplitude modulator 5 and are connected to gain control input terminals of the variable gain control circuit 31 in the transmission system 3.

Figure 9:
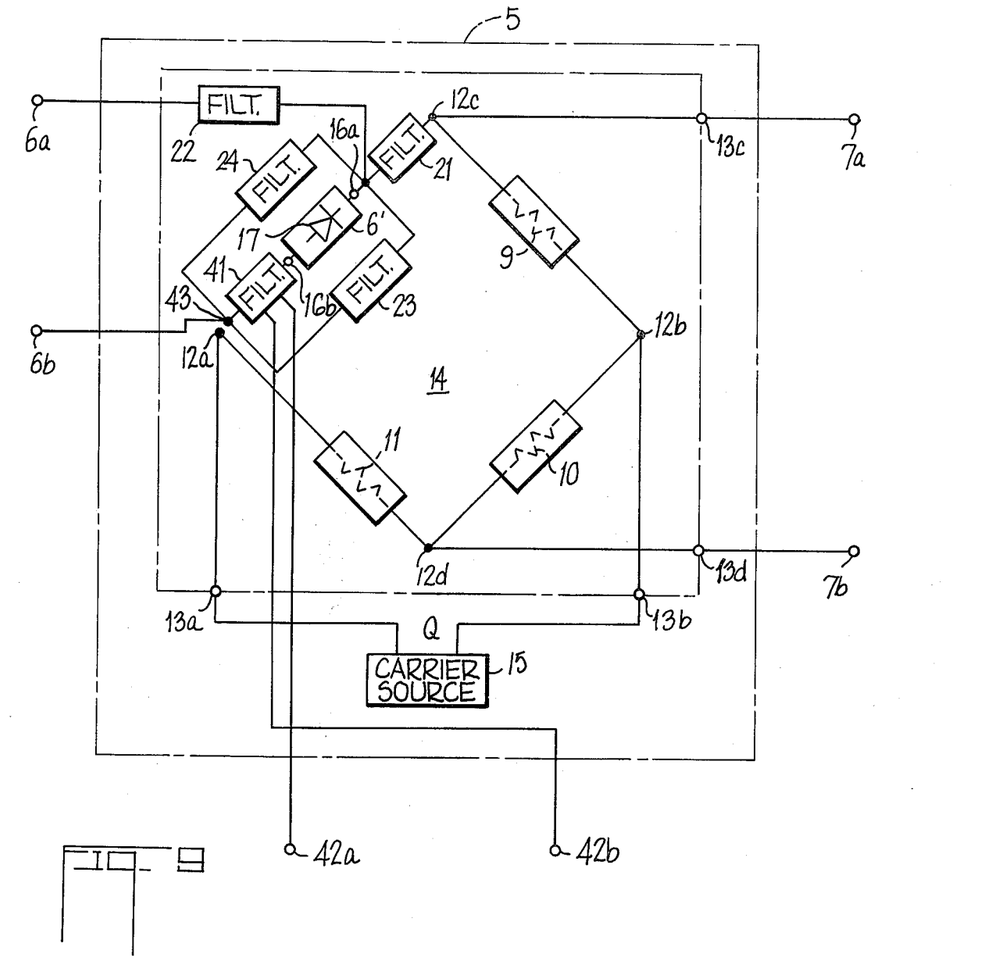
FIG. 9 is a schematic circuit diagram of an amplitude modulator suitable for use in the circuit in FIG. 8.

The amplitude modulator 5 in FIG. 8 is shown in more detail in FIG. 9 and is quite similar to that in FIG. 6 except that it includes a smoothing circuit 41 in series with the variable impedance 6'. The output terminals 42a and 42b are connected to this smoothing circuit 41.

Figure 10:
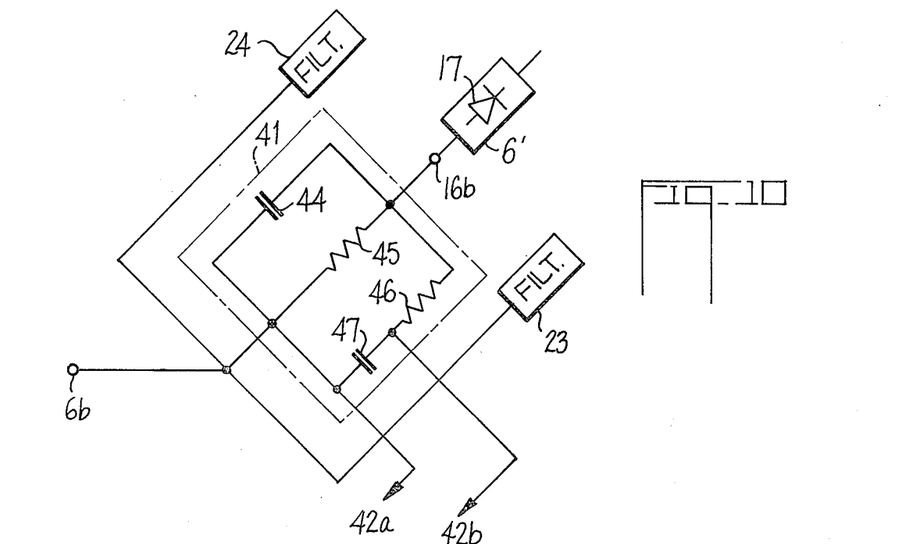
FIG. 10. is a schematic diagram of a smoothing filter for use in the circuit in FIG. 9.

The smoothing circuit 41 is shown in greater detail in FIG. 10, where it is seen to include a first capacitor 44 which is directly in series with the variable impedance 6' and which by-passes the high frequency currents of the signal S2 and the carrier signal Q. A resistor 45 is connected directly in parallel with the capacitor 44 to form an integrating, or smoothing circuit. Further smoothing circuit elements include a resistor 46 and a capacitor 47 connected in series with each other. The resulting series circuit is connected in parallel with the capacitor 44 and the resistor 45. The output terminals 42a and 42b are connected across the capacitor 47. The circuit components in the smoothing circuit 41 are selected so that the overall time constant is long compared to any frequency in the signal S3 in FIG. 3. Thus, the voltage across the capacitor 47 is a direct voltage indicated in FIG. 3 as the voltage S6, which corresponds to the voltage S5 developed at the output of the smoothing circuit 32 in FIG. 7.

The operation of the circuit in FIG. 8 including the circuits shown in greater detail in FIGS. 9 and 10, is basically quite similar to that of FIG. 7. Any shift in the frequency $f_o$ of the signal S1 from the FM source 1 produces a correcting effect in the direct voltage across the capacitor 47, and this correcting voltage changes the gain of the variable gain circuit 31 so that the magnitude of the voltage S2 at the output of the filter 2 is the correct value for the frequency $f_o$ and therefore is the correct value for all other frequencies in the band.

Figure 11:
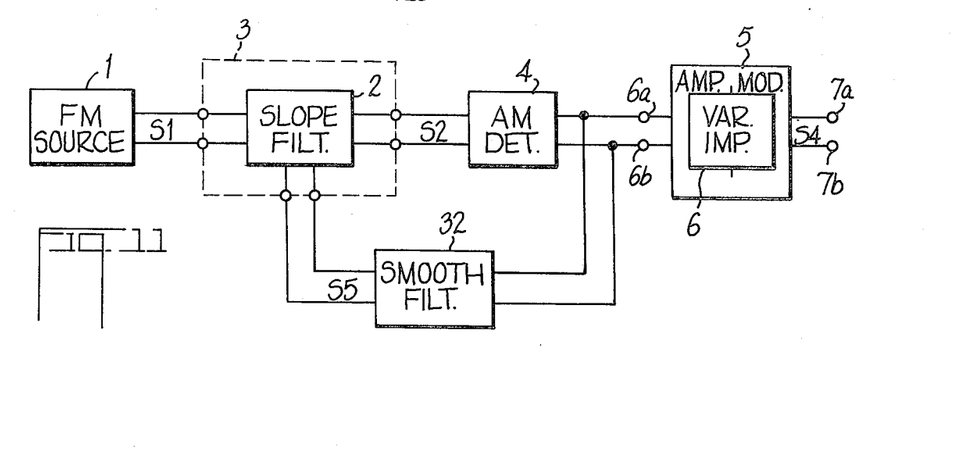
FIGS. 11 and 12 are block diagrams of other embodiments of the present invention.

Instead of controlling the gain of the signal passing through the transmission system 3 and applied to the input of the filter 2, it is possible to control the bandpass characteristics of the filter 2 so that the frequency response of the filter can be shifted from the normal response AO shown in FIG. 4 to the appropriate alternative response AH or AL. FIG. 11 shows a circuit for accomplishing this.

FIG. 11 is similar to FIG. 7 except that the output of the smoothing circuit 32 is not connected to a variable gain control circuit in the transmission system 3 but is connected to the filter 2. It is known to provide filters that have a sloping characteristic over a certain frequency band and that are capable of having this sloping characteristic shifted to higher or lower frequency regions in response to the amplitude of a control signal. Such a circuit is shown in U.S. Pat. No. 3,911,371 assigned to the assignee of the present application. The circuit in that application operates in a relatively low frequency band, but other filter circuits for operation in higher frequency bands and capable of adjusting the tuning in a corresponding manner may be provided.

The operation of the circuit in FIG. 11 directly shifts the frequency response of the filter 2 rather than shifting the effect by changing the amplitude of the signal applied to the filter 2. The shift has the same effect on the amplitude modulated output signal S4 as in the case of the amplitude control effected by circuits in FIGS. 7 and 8.

Figure 12:
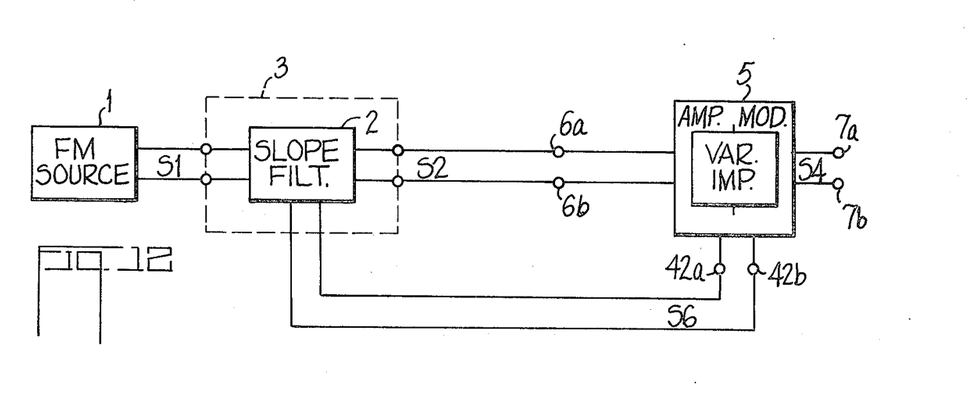

FIG. 12 shows a modification of the circuit in FIG. 11. Instead of obtaining a control signal from an envelope detector 4 for the smoothing circuit 32, as was done in FIG. 11, FIG. 12 obtains a smoothed signal from the terminals 42a and 42b of the amplitude modulator 5. Thus the amplitude modulator 5 in FIG. 12 may be exactly the modulator shown in FIGS. 9 and 10. The terminals 42a and 42b are connected back to the filter 2 to control the frequency response of that filter in exactly the same manner as the output signal of the smoothing circuit 32 controlled the frequency response of the filter 2 in FIG. 11.

The foregoing is merely illustrative of some embodiments of the invention. For example, the diode 17 illustrated in FIGS. 2, 6, and 9 is only one possible element that may be employed as the variable impedance 6 or 6'. A fixed impedance can be connected in series or in parallel with the variable impedance 6 or 6'. Still another possible modification is to substitute a circulator or the like for the amplitude modulator 5 in FIGS. 2, 6 and 9, provided the circuit includes a variable impedance element that varies with changes in voltage or current and can receive the necessary input voltage or current to produce the desired change in impedance. Still another modification would be to substitute a galvanometer for the circuit 41 in FIG. 9 to detect the mean value of the current through the impedance 6'. These and other modifications may be made without departing from the true scope of the invention as defined by the following claims.

What is claimed is:

1. An FM-AM converter comprising:
   A. a transmission system comprising a slope filter having a frequency response that varies monotonically over a predetermined frequency band;
   B. means to apply an FM signal to said filter, said FM signal being within said frequency band, whereby said FM signal is modified by said filter to an amplitude modulated FM signal, the envelope of which corresponds to the signal that modulates the frequency of said FM signal;
   C. a carrier signal source;
   D. means connected to said transmission system to receive the amplitude modulated FM signal from said filter and connected to said carrier source to receive the carrier signal therefrom and to modulate the amplitude of said carrier signal by a signal corresponding to the envelope of said amplitude modulated FM signal; and
   E. control means responsive to the mean value of the signal corresponding to the envelope of said amplitude modulated FM signal to control said transmission system to maintain the mean value of said amplitude modulated FM signal substantially constant.

2. The FM-AM converter of claim 1 in which said filter has a frequency response that varies linearly over said band, and said FM signal has a substantially constant amplitude.

3. The FM-AM converter of claim 2 in which said filter is variable, and said control means is connected to said filter to vary said frequency band.

4. The FM-AM converter of claim 2 in which said control means comprises a variable gain circuit comprising an input section to receive said FM signal and an output section connected to said filter to supply said FM signal to said filter at a controlled amplitude.

5. The FM-AM converter of claim 4, in which said means connected to said transmission system to receive the amplitude modulated FM signal comprises:
   A. an envelope detector connected to said filter to demodulate said amplitude modulate FM signal to derive the envelope signal therefrom; and
   B. an amplitude modulator connected to said carrier source to receive the carrier signal therefrom and connected to said envelope detector to receive the envelope signal therefrom to modulate the amplitude of said carrier, said control means being connected to the output of said envelope detector to receive the envelope signal therefrom to control said transmission system according to the mean value of said envelope.

6. The FM-AM converter of claim 4, in which said means connected to said transmission system to receive the amplitude modulated FM signal comprises a bridge modulator connected to said carrier source to receive the carrier signal therefrom, one arm of said bridge modulator comprising:
   A. rectifying means connected to said filter to receive said amplitude modulated FM signal therefrom;
   B. a smoothing circuit connected to said rectifying means to derive therefrom a signal having a value substantially equal to the mean amplitude of said amplitude modulated FM signal; and
   C. means connecting said smoothing circuit to said transmission system to control said transmission system according to the mean value of said amplitude modulated FM signal.

7. The FM-AM converter of claim 6, comprising, in addition:
   A. a second filter that transmits signals having a frequency equal to the difference between the frequency of the carrier of said FM signal and the frequency of said carrier signal from said carrier signal source; and
   B. a third filter transmitting signals having a frequency equal to the sum of the frequencies of said carrier of said FM signal and said carrier signal from said carrier signal source, said second and third filters being connected to said variable impedance to shunt signals having said sum and difference frequencies around said variable impedance.

* * * * *